(12) United States Patent
Kikuchi (10) Patent No.: US 11,019,761 B2
(45) Date of Patent: May 25, 2021

(54) MOUNTING HEAD AND COMPONENT MOUNTER

(71) Applicant: Panasonic Intellectual Property Management Co., Ltd., Osaka (JP)

(72) Inventor: Mami Kikuchi, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 238 days.

(21) Appl. No.: 16/235,016

(22) Filed: Dec. 28, 2018

(65) Prior Publication Data

US 2019/0297760 A1 Sep. 26, 2019

(30) Foreign Application Priority Data

Mar. 26, 2018 (JP) .............................. JP2018-058393
Mar. 26, 2018 (JP) .............................. JP2018-058394

(51) Int. Cl.
*B23P 19/00* (2006.01)
*H05K 13/08* (2006.01)
*H05K 13/04* (2006.01)

(52) U.S. Cl.
CPC ..... *H05K 13/0815* (2018.08); *H05K 13/0409* (2018.08); *H05K 13/0812* (2018.08); *Y10T 29/53174* (2015.01)

(58) Field of Classification Search
USPC ......... 29/739, 703, 709, 720, 740, 743, 832, 29/833, 834
See application file for complete search history.

(56) References Cited

U.S. PATENT DOCUMENTS 10,260,996 B2 * 4/2019 Morita ............. G05B 19/41875
2017/0325370 A1 * 11/2017 Nozawa ............. H05K 13/0813

FOREIGN PATENT DOCUMENTS

JP H05-037198 A 2/1993

* cited by examiner

*Primary Examiner* — Thiem D Phan
(74) *Attorney, Agent, or Firm* — Pearne & Gordon LLP (57) ABSTRACT

A mounting head that is included in a component mounter for mounting a component on a board and sucks the component by a nozzle is provided. The mounting head includes: a nozzle shaft that is disposed to be freely upward and downward movable and has the nozzle installed at a lower end of the nozzle shaft; an imaging element holder that moves upward and downward according to upward and downward movement of the nozzle shaft; and an imaging element that is held by the imaging element holder and images an area including a lower end of the nozzle.

13 Claims, 9 Drawing Sheets

MOUNTING HEAD AND COMPONENT MOUNTER

BACKGROUND

1. Technical Field

The present disclosure relates to a mounting head which is provided in a component mounter for mounting a component on a board and sucks the component, and the component mounter.

2. Description of the Related Art

The component mounter positions a board at a predetermined position in advance, sucks a component supplied by a component supplier by a nozzle of a mounting head, and mounts the component on the board by moving the mounting head onto the board. Before the component sucked by the nozzle is moved onto the board, the component is imaged from below and recognized by a separately provided component camera. Meanwhile, a landing position of the board on which the component is mounted is grasped based on previously stored production data. When position deviation of the component imaged and recognized by the component camera with respect to the nozzle is detected, the position of the nozzle with respect to the board is corrected such that the position deviation is resolved.

Further, in the related art, a technology has been known in which an imaging element is provided in the mounting head so that a tip end portion of the nozzle can be imaged, and thus a suction state of the component with respect to the nozzle can be determined (for example, Japanese Patent Unexamined Publication No. H5-37198). The component mounter having such a configuration has an advantage in that since the component sucked by the nozzle together with the nozzle can be visually recognized, a positional relationship between the nozzle and the component can be grasped more accurately, and mounting deviation of the component with respect to the board can be reduced, as compared with a case where the component sucked by the nozzle is visually recognized from below by the component camera.

SUMMARY

A mounting head according to the present disclosure, which is included in a component mounter for mounting a component on a board and sucks the component by a nozzle, is provided. The mounting head includes: a nozzle shaft that is disposed to be freely upward and downward movable and has a nozzle installed at a lower end of the nozzle shaft; an imaging element holder that moves upward and downward according to upward and downward movement of the nozzle shaft; and an imaging element that is held by the imaging element holder and images an area including a lower end of the nozzle.

A component mounter according to the present disclosure includes: the mounting head according to the present disclosure; and a controller that operates the mounting head to mount the component on the board. The controller operates the mounting head based on an image obtained by imaging by the imaging element, to mount the component sucked by the nozzle on the board.

According to the present disclosure, mounting accuracy of a component with respect to a board can be improved.

DETAILED DESCRIPTION

Mounting deviation of a component with respect to a board greatly affects manufacturing quality of the board. Thus, in recent years, a technology has been required in which while the number of components is minimized, the mounting deviation of the component becomes smaller than before, and the component can be more accurately mounted on the board.

An aspect of the present disclosure is to provide a mounting head and a component mounter which can improve mounting accuracy of a component with respect to a board.

Figure 1:
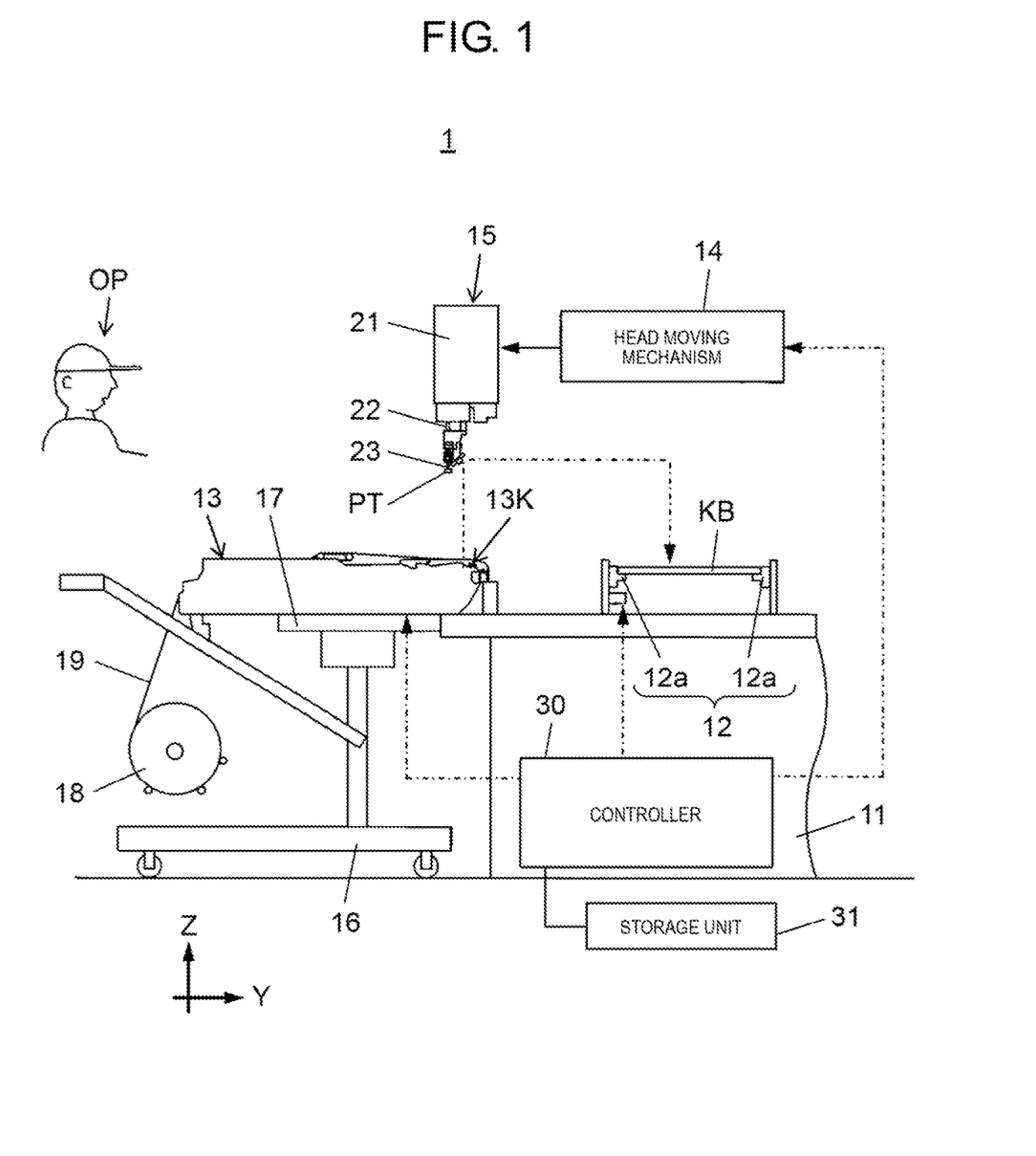
FIG. 1 is a side view illustrating a component mounter according to an embodiment of the present disclosure.

Hereinafter, an embodiment of the present disclosure will be described with reference to the drawings. FIG. 1 illustrates component mounter 1 according to the embodiment of the present disclosure. Component mounter 1 operates to carry board KB supplied from an upstream process side in, position board KB at a working position, mount component PT on board KB, and then carry board KB out to a downstream process side. In the present embodiment, a left-right direction (a direction that is orthogonal to a page space of FIG. 1) when viewed from operator OP is set as an X axis direction, and a front-rear direction (a left-right direction of the page space of FIG. 1) when viewed from operator OP is set as a Y axis direction. Further, an up-down direction (an up-down direction of the page space of FIG. 1) is set as a Z axis direction.

In FIG. 1, component mounter 1 includes base 11, board transporter 12, plurality of tape feeders 13, head moving mechanism 14, and mounting head 15. Board transporter 12 includes pair of conveyor mechanisms 12a extending from base 11 in the X axis direction, and transports board KB in the X axis direction to position board KB at a predetermined working position. Plurality of tape feeders 13 is installed side by side in the X axis direction on feeder base 17 of carriage 16 connected to base 11. Each tape feeder 13 pitch-feeds carrier tape 19 supplied from reel 18, and supplies component PT held by carrier tape 19 to component supply port 13K. Reel 18 is held on carriage 16.

In FIG. 1, head moving mechanism 14 is, for example, an orthogonal coordinate beam mechanism, and moves mounting head 15 in a direction inside a horizontal plane. Mounting head 15 includes head base portion 21 moved by head moving mechanism 14, and plurality of (here, four) nozzle shafts 22 extending downward from head base portion 21 (FIG. 2 and FIG. 3).

Figure 2:
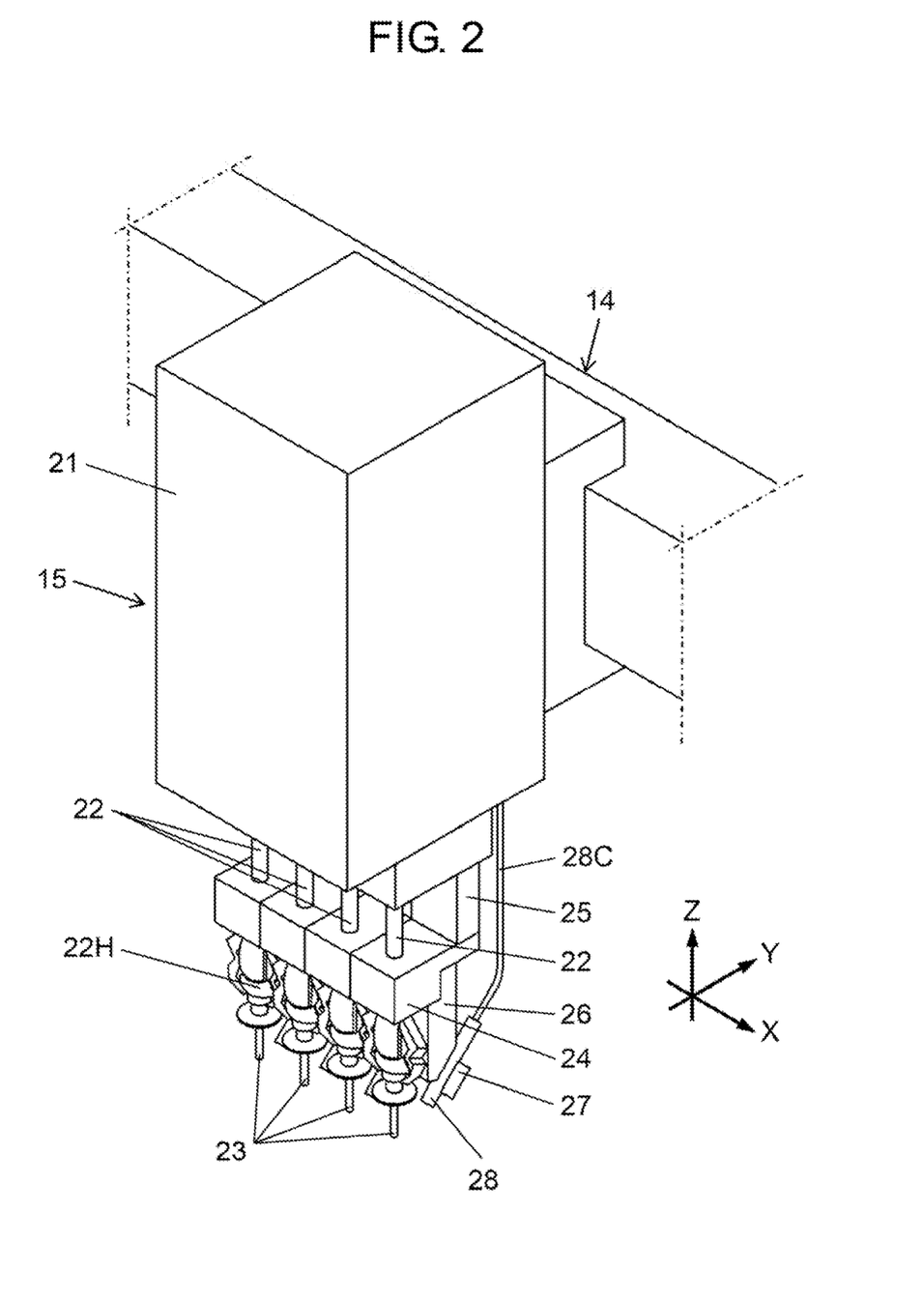
FIG. 2 is a perspective view illustrating a mounting head of the component mounter according to the embodiment of the present disclosure.
Figure 3:
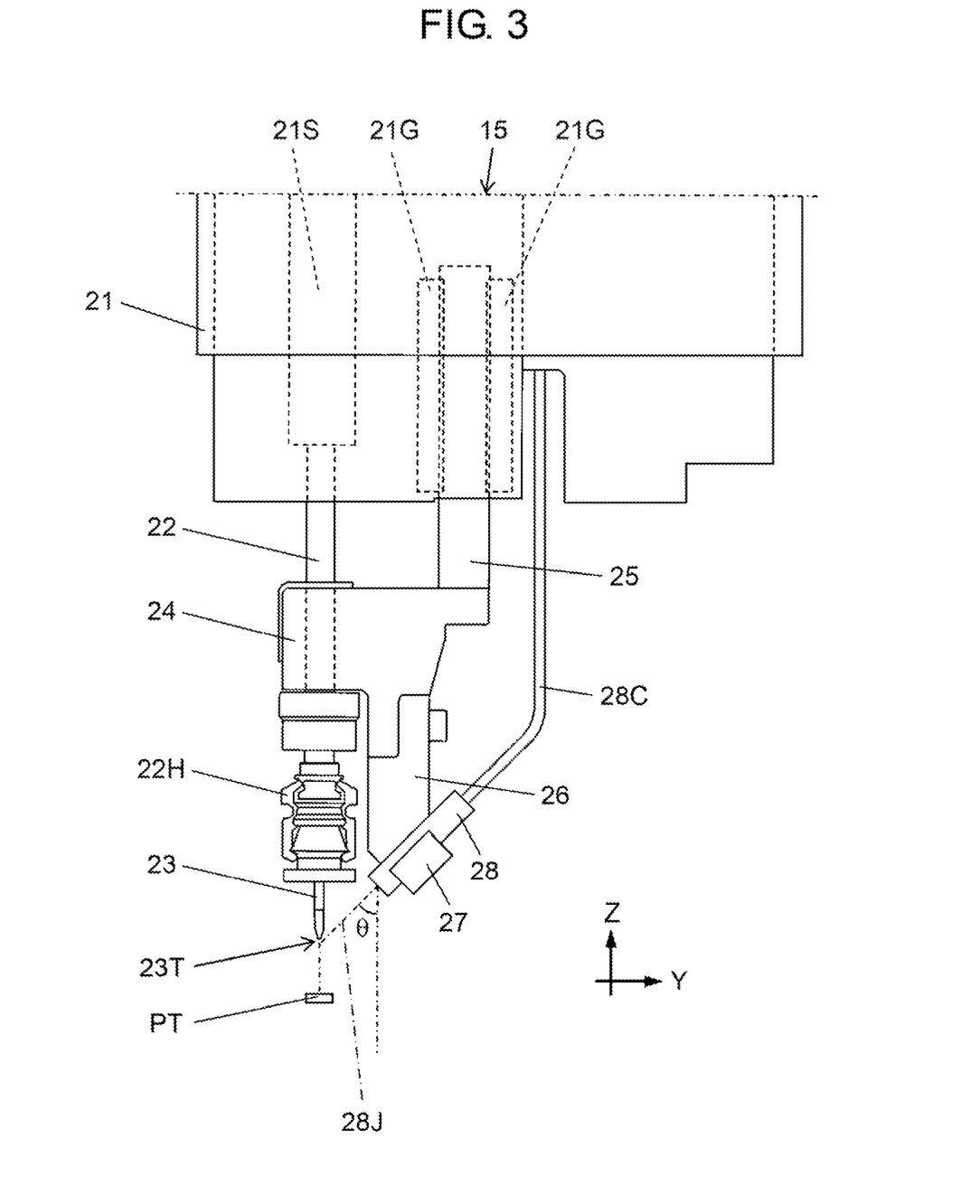
FIG. 3 is a side view illustrating a part of the mounting head of the component mounter according to the embodiment of the present disclosure.

In FIGS. 2 and 3, nozzle 23 is detachably installed at a lower end of each nozzle shaft 22 through nozzle holder 22H. Nozzle shaft 22 is freely movable upward and downward with respect to head base portion 21, and is freely rotatable about a central axis line (a Z axis). Nozzle shaft 22 is driven by cylinder 21S (FIG. 3) provided in head base portion 21 to move upward and downward together with nozzle 23, and is driven by a not-illustrated motor provided in head base portion 21 to rotate about the central axis line.

Nozzle shaft 22 is configured with a hollow member, and an internal space thereof communicates with nozzle 23 installed in nozzle shaft 22. When a vacuum pressure is supplied from the outside of component mounter 1 into nozzle shaft 22 through a not-illustrated vacuum pipe path, a vacuum suction force is generated at lower end 23T (FIG. 3) of nozzle 23.

In FIGS. 2 and 3, imaging element holder 24 is fixedly provided at a lower portion (on an upper side of nozzle holder 22H) of nozzle shaft 22. Imaging element holder 24 has slider portion 25 extending upward and downward extending portion 26 extending downward.

Figure 4A:
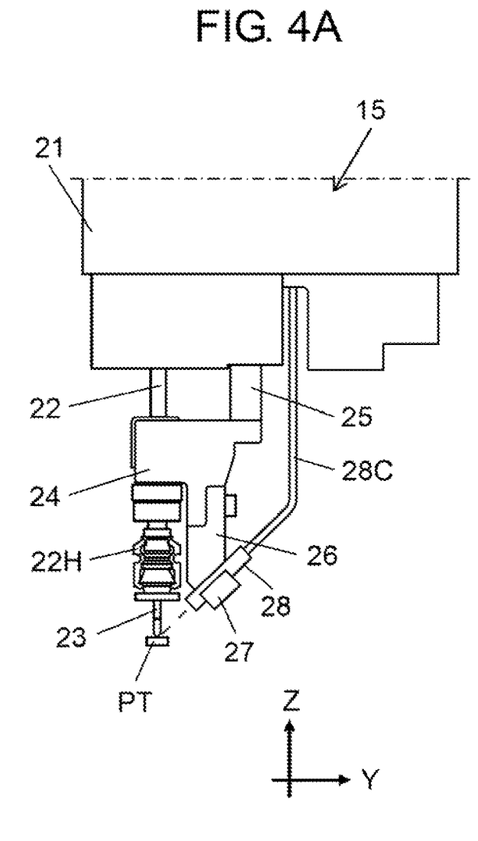
FIG. 4A is a side view of the part of the mounting head, which illustrates a situation in which an imaging element of the mounting head of the component mounter according to the embodiment of the present disclosure moves upward and downward while being integrated with a nozzle through an imaging element holder.
Figure 4B:
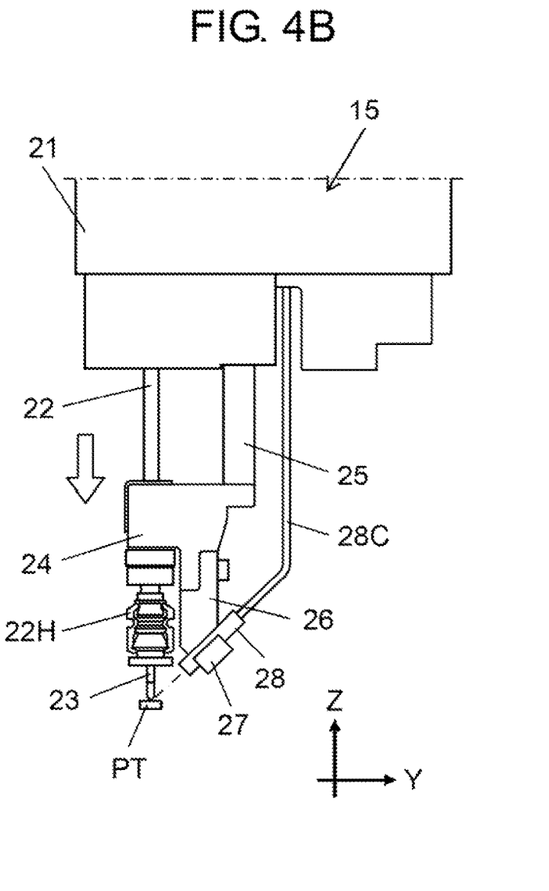
FIG. 4B is a side view of the part of the mounting head, which illustrates the situation in which the imaging element of the mounting head of the component mounter according to the embodiment of the present disclosure moves upward and downward while being integrated with the nozzle through the imaging element holder.

In FIGS. 2 and 3, slider portion 25 is slidably guided in an up-down direction by guide portion 21G provided inside head base portion 21. When nozzle shaft 22 moves upward and downward with respect to head base portion 21, imaging element holder 24 moves upward and downward with respect to head base portion 21 integrally with nozzle shaft 22 while causing slider portion 25 to be slid with respect to guide portion 21G (FIGS. 4A and 4B). Here, FIG. 4A illustrates a state in which nozzle shaft 22 is located in a normal position where nozzle shaft 22 is not lowered with respect to head base portion 21, and FIG. 4B illustrates a state in which nozzle shaft 22 is lowered from the normal position.

In FIG. 3, element holder 27 is formed at a lower end of downward extending portion 26 of imaging element holder 24. Imaging element 28 is detachably held in element holder 27. In a state in which imaging element 28 is installed in element holder 27, imaging optical axis 28J is inclined by a predetermined angle θ from a vertically downward direction, and imaging element 28 images an area including lower end 23T of nozzle 23 from an obliquely upward direction (that is, in an overviewing posture). Therefore, lower end 23T of nozzle 23 is included in a visual field of imaging element 28, and lower end 23T of nozzle 23 is necessarily displayed inside an image imaged by imaging element 28.

Figure 5:
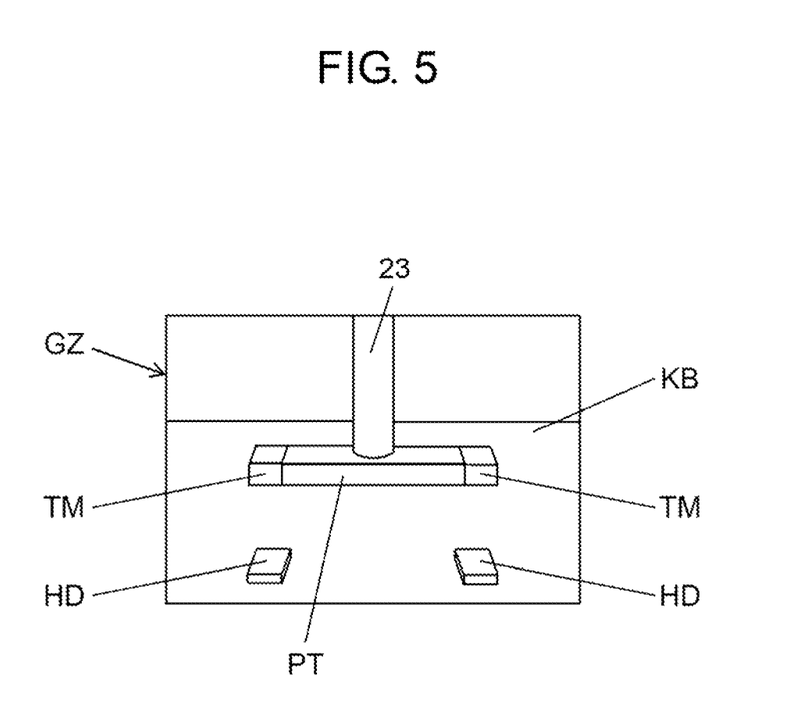
FIG. 5 is a view illustrating an example of an image imaged by the imaging element of the mounting head of the component mounter according to the embodiment of the present disclosure.

Further, as described above, since lower end 23T of nozzle 23 is included in the visual filed of imaging element 28, in a state in which component PT is sucked by nozzle 23, component PT sucked by nozzle 23 is displayed at an overviewing angle in image GZ (FIG. 5) obtained by imaging by imaging element 28. Further, when sucked component PT approaches solder HD (a position where component PT is mounted) corresponding to an upper portion of board KB, an image of solder HD is also displayed in image GZ (FIG. 5).

In FIG. 1, controller 30 included in component mounter 1 controls an operation of transporting board KB by board transporter 12 and positioning board KB to the working position. Further, controller 30 controls an operation of supplying component PT by each tape feeder 13. Further, controller 30 controls movement of mounting head 15 by head moving mechanism 14. Further, controller 30 controls upward and downward movement of nozzle shaft 22 (that is, nozzle 23) and rotation of nozzle shaft 22 about Z axis by mounting head 15. Further, controller 30 controls an operation of generating a vacuum suction force at lower end 23T of nozzle 23.

In FIG. 3, imaging element 28 is connected to controller 30 through cable 28C, and controller 30 controls imaging element 28 through cable 28C. Image data obtained by imaging by imaging element 28 is transmitted to controller 30 through cable 28C.

In FIG. 1, controller 30 includes storage unit 31. Storage unit 31 stores various kinds of data, and stores various kinds of data related to mounting of component PT on board KB as production data in addition to a mounting program in which operation sequence data of each unit of component mounter 1 is recorded. The production data includes at least detailed data of component PT to be mounted on board KB, position data of land LD in board KB, data representing the type, a mounting direction, and the like of component PT mounted on land LD, position data of solder HD obtained by inspecting solder HD deposited on board KB, and deposition data of solder HD. Controller 30 performs required determination and processing based on the image data obtained by imaging by imaging element 28 and the production data, and bonds component PT to solder HD according to the mounting program, to mount component PT on board KB.

Figure 6:
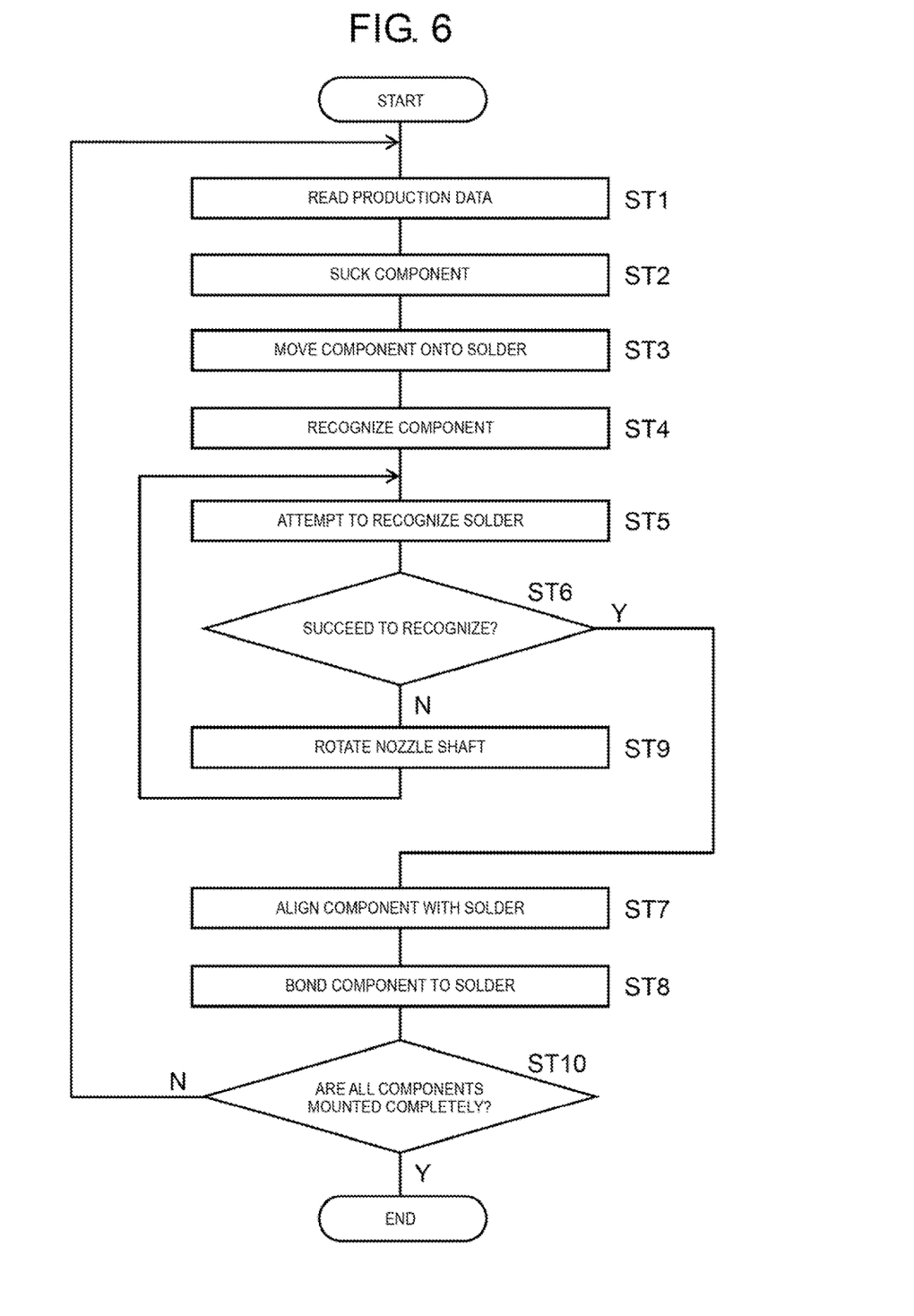
FIG. 6 is a flowchart illustrating flow of a component mounting process executed by the component mounter according to the embodiment of the present disclosure.

A flowchart of FIG. 6 illustrates flow of a component mounting process executed by controller 30. In the component mounting process, controller 30 firstly reads the production data from storage unit 31 (step ST1), and sucks, to nozzle 23, component PT supplied to component supply port 13K by tape feeder 13 (step ST2). After sucking component PT to nozzle 23, controller 30 controls mounting head 15 to move component PT onto solder HD (step ST3). Accordingly, both component PT and solder HD are displayed inside image GZ obtained by imaging by imaging element 28.

When moving component PT sucked to nozzle 23 onto solder HD, controller 30 recognizes component PT based on image GZ obtained by imaging by imaging element 28 (step ST4). In recognizing component PT, firstly, the shape of sucked component PT is recognized. Thus, the recognized shape is pattern-matched with shape data of component PT included in the production data, so that whether or not component PT coincides with the production data is identified. When the pattern matching cannot be performed from one direction, the shape recognized from a plurality of directions by rotating component PT about the central axis line may be pattern-matched with the shape data of component PT.

When it is identified that component PT coincides with the production data, controller 30 obtains the position of terminal TM (FIG. 5) of component PT with respect to nozzle 23. The position of terminal TM of component PT is obtained by calculation based on information on a posture of component PT with respect to nozzle 23 and the position of terminal TM of component PT recorded in the production data in advance. In component mounter 1 according to the present embodiment, since component PT sucked to nozzle 23 can be visually identified together with nozzle 23, a positional relationship (in more detail, a positional relationship between nozzle 23 and terminal TM) between nozzle 23 and component PT sucked to nozzle 23 is required with high precision.

When recognizing component PT as described above, controller 30 attempts to recognize solder HD on which component PT is mounted (step ST5). The recognition of solder HD is performed by pattern matching between the shape of solder HD recognized from image GZ and the shape of solder HD recorded in the production data in advance. The recognition of solder HD is performed with respect to all solders HD to be bonded to terminal TM of component PT. As a result, when all solders HD to be bonded can be visually recognized ("Y" in step ST6), the position of visually recognized solder HD is obtained, and a positional relationship between component PT and solder HD is grasped. In this way, the positional relationship between component PT and solder HD, which is grasped in a state in which both component PT and solder HD are included inside image GZ obtained by imaging by imaging element 28, is very accurate. When solder HD is not deposited at a position where component PT is mounted, and a part of deposited solder HD is missed, the operator is informed that component PT is not mounted. Further, the position of the land contacting solder HD deposited on board KB may be also recognized, the recognized shape may be pattern-matched with the shape data of component PT included in the production data, and whether or not component PT coincides with the production data may be identified.

Figure 7A:
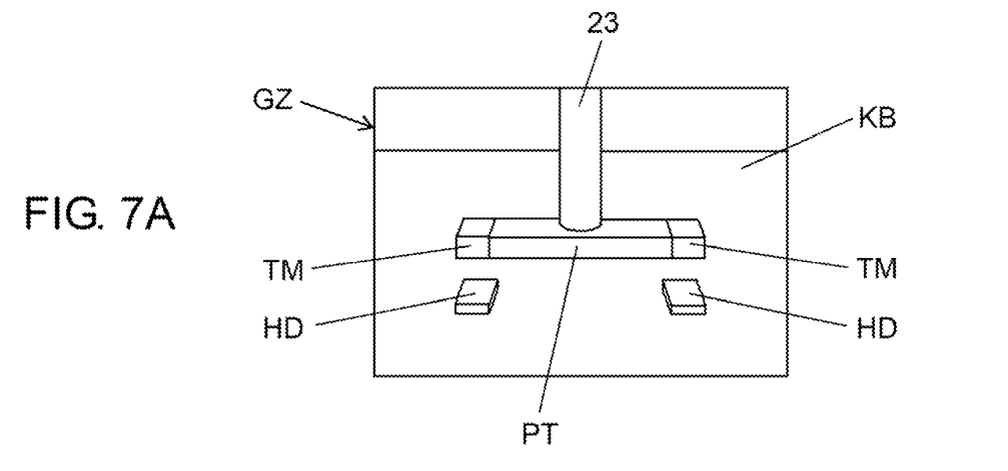
FIG. 7A is a view illustrating an example of a procedure of mounting a component on a board by the mounting head of the component mounter according to the embodiment of the present disclosure.
Figure 7B:
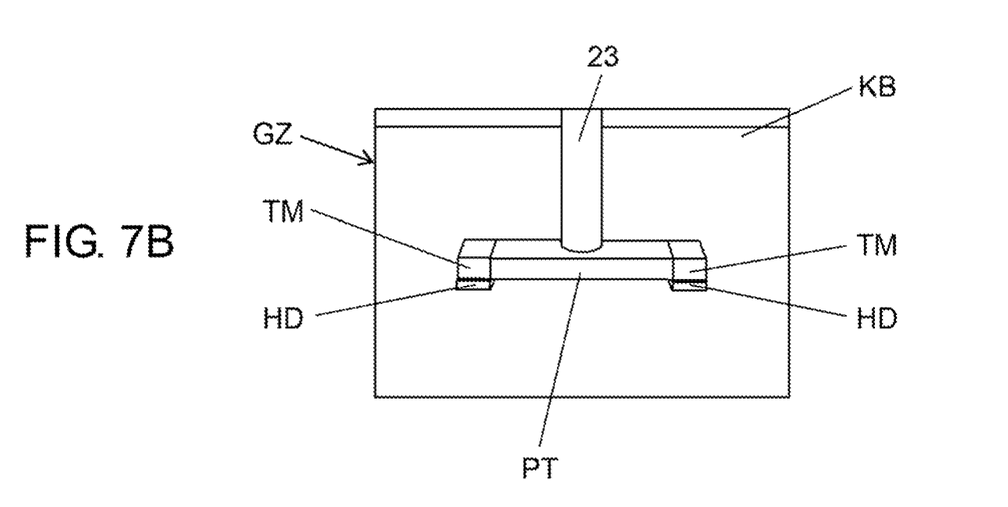
FIG. 7B is a view illustrating the example of the procedure of mounting the component on the board by the mounting head of the component mounter according to the embodiment of the present disclosure.

When the positional relationship between component PT and solder HD is grasped as described above, controller 30 positions terminal TM of component PT above solder I-ID and aligns component PT and solder H D based on the grasped positional relationship (step ST7 and FIG. 7A). Thus, when the alignment is completed, nozzle shaft 22 is lowered, terminal TM is bonded to solder HD (step ST8). Accordingly, component PT is mounted on board KB (FIG. 7B). Controller 30 determines whether component PT is mounted with respect to solder HD or the land, according to a position deviation state between solder HD deposited on board KB and the land formed in board KB.

Figure 8A:
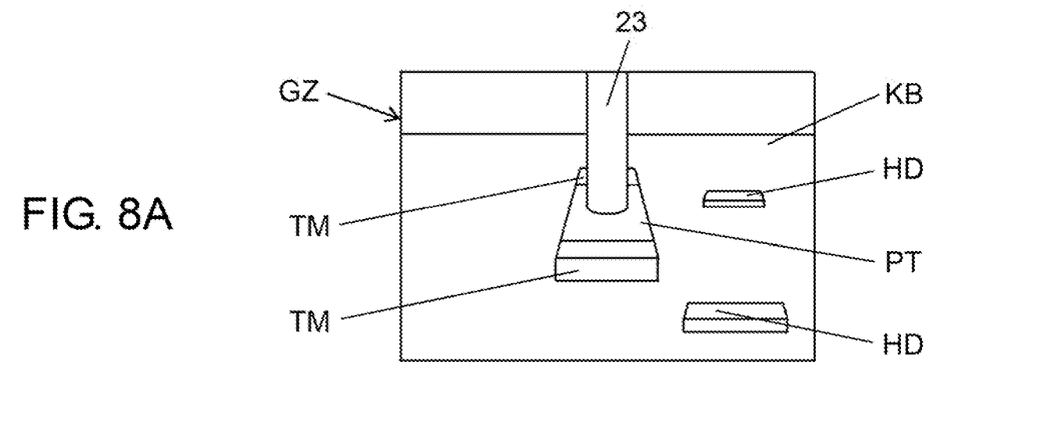
FIG. 8A is a view illustrating the example of the procedure of mounting the component on the board by the mounting head of the component mounter according to the embodiment of the present disclosure.
Figure 8B:
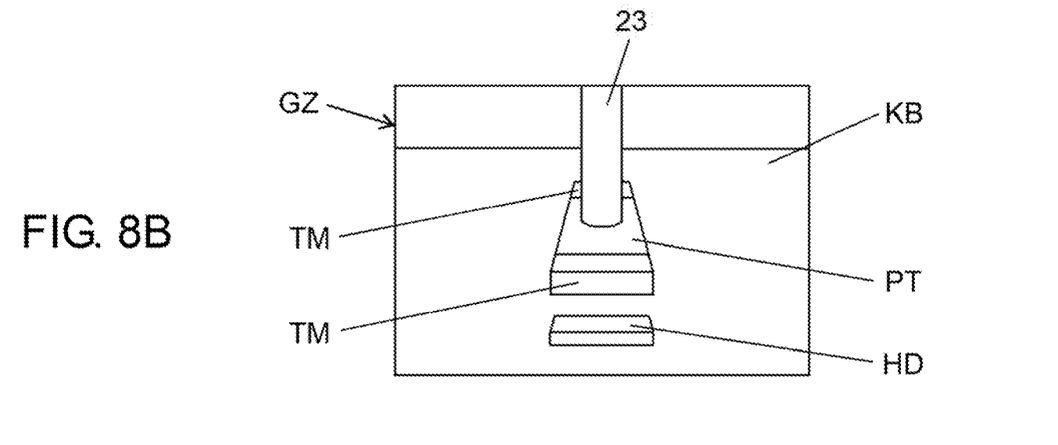
FIG. 8B is a view illustrating the example of the procedure of mounting the component on the board by the mounting head of the component mounter according to the embodiment of the present disclosure.
Figure 8C:
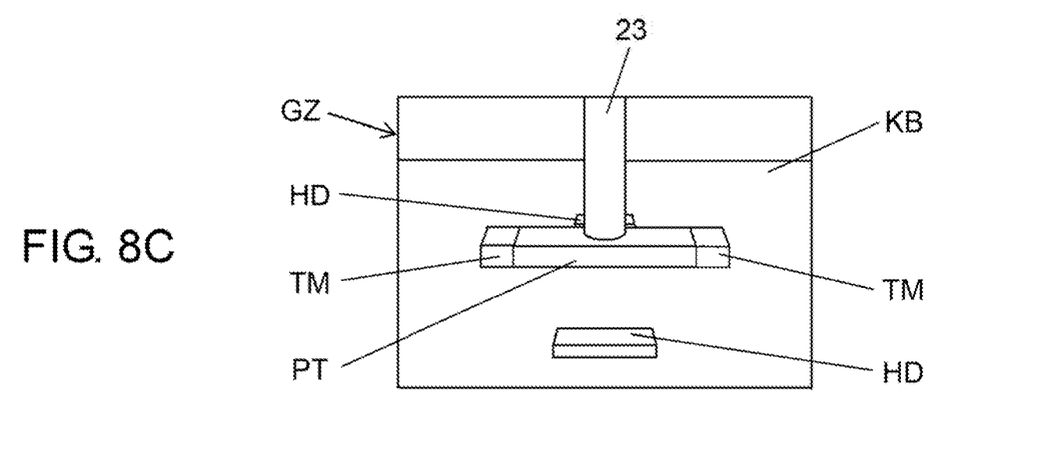
FIG. 8C is a view illustrating the example of the procedure of mounting the component on the board by the mounting head of the component mounter according to the embodiment of the present disclosure.
Figure 9A:
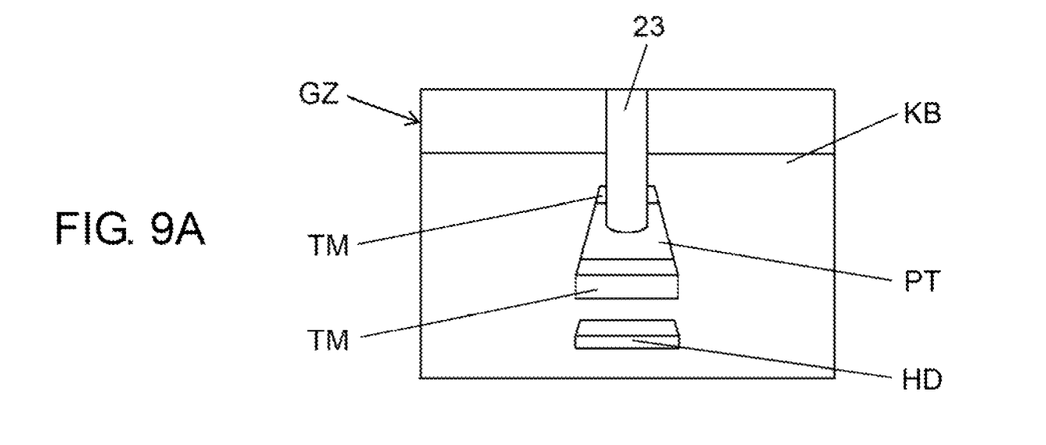
FIG. 9A is a view illustrating the example of the procedure of mounting the component on the board by the mounting head of the component mounter according to the embodiment of the present disclosure.
Figure 9B:
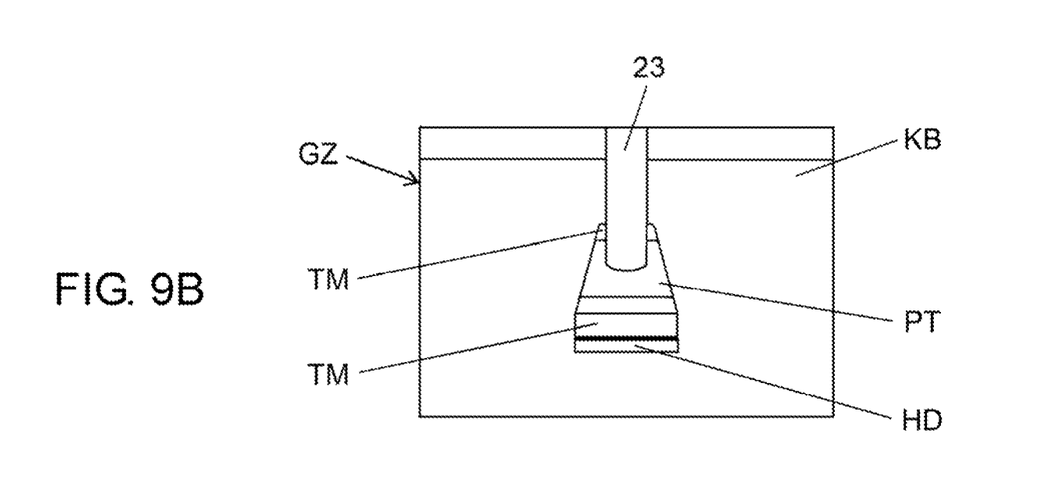
FIG. 9B is a view illustrating the example of the procedure of mounting the component on the board by the mounting head of the component mounter according to the embodiment of the present disclosure.

Meanwhile, as solder HD is hidden by component PT sucked by nozzle 23 (FIG. 8A→FIG. 8B), when even a part of solder HD to be bonded cannot be visually recognized ("N" in step ST6), controller 30 rotates nozzle shaft 22 about the central axis line (step ST9). Accordingly, when component PT is rotated so that an imaging area is secured by imaging element 28 (FIG. 8C), the process returns to step ST5, and solder HD is recognized again. As a result, solder HD, which has been hidden by component PT and cannot be visually recognized, can be visually recognized (FIG. 8C). When entire solder HD to be bonded can be visually recognized, the process proceeds to step ST7, and component PT is aligned with solder HD (FIG. 9A). Thus, when the alignment is completed, nozzle shaft 22 is lowered, terminal TM of component PT is bonded to solder HD (step ST8). Accordingly, component PT is mounted on board KB (FIG. 9B).

Here, imaging element 28 moves upward and downward integrally with nozzle shaft 22 through imaging element holder 24, the area including lower end 23T of nozzle 23 can be imaged regardless of an elevation position of nozzle shaft 22. Therefore, even if nozzle shaft 22 (that is, nozzle 23) is lowered when component PT is mounted, component PT sucked by nozzle 23 can be continuously visually recognized, and component PT can be mounted on board KB while component PT and solder HD is simultaneously visually recognized (that is, while component PT is viewed).

As described above, when component PT is mounted on board KB, whether or not all component PT to be mounted on board KB is completely mounted is determined (step ST10). Thus, in the determination, when there is component PT to be mounted on board KB, the process returns to step ST1. When all components PT to be mounted on board KB are completely mounted, a series of the component mounting process is terminated.

As described above, in component mounter 1 according to the present embodiment, imaging element 28 is held by imaging element holder 24 that moves upward and downward according to the upward and downward movement of nozzle shaft 22 included in mounting head 15. Since imaging element 28 images the area including lower end 23T of nozzle 23 regardless of an elevation position of nozzle 23, even when nozzle 23 is lowered when component PT is mounted, component PT sucked by nozzle 23 can be continuously and visually recognized. Therefore, while component PT and solder HD are simultaneously and visually recognized (that is, while component PT is viewed), mounting head 15 is operated based on image GZ obtained by imaging by imaging element 28, so that component PT sucked by nozzle 23 can be mounted on board KB. In detail, after component PT sucked by nozzle 23 is moved to an upper side of solder HD, in a state in which both component PT and solder HD are included in image GZ obtained by imaging by imaging element 28, the positional relationship between component PT and solder HD is grasped. Component PT is bonded to solder HD based on the grasped positional relationship, so that component PT is mounted on board KB while component PT is viewed. Thus, according to component mounter 1 according to the present embodiment, mounting accuracy of component PT with respect to board KB can be remarkably improved.

Although the embodiment of the present disclosure has been described so far, the present disclosure is not limited to the above description, and various design changes or the like can be applied. For example, in the above-described embodiment, imaging element holder 24 holding imaging element 28 is fixedly provided in nozzle shaft 22. However, this is for causing imaging element holder 24 (thus, imaging element 28) to move upward and downward according to the upward and downward movement of nozzle shaft 22. Thus, imaging element holder 24 may have another configuration in which imaging element holder 24 moves upward and downward according to the upward and downward movement of nozzle shaft 22, and imaging element holder 24 may be driven by another drive mechanism to move upward and downward in synchronization with nozzle shaft 22. Further, although the number of nozzle shaft 22 included in mounting head 15 and the number of nozzle 23 installed therein are four, this configuration is merely one example, and the number may be three or more or may be five or more.

Mounting head and component mounter which can improve mounting accuracy of a component with respect to board are provided.

What is claimed is:

1. A mounting head that is included in a component mounter for mounting a component on a board, moved by a head moving mechanism and sucks the component by a nozzle, the mounting head comprising:
    a head base portion moved by the head moving mechanism;
    a nozzle shaft that is disposed to be freely upward and downward movable and has the nozzle installed at a lower end of the nozzle shaft;
    an imaging element holder that moves upward and downward independently from the head base portion according to an upward and downward movement of the nozzle shaft; and
    an imaging element that is held by the imaging element holder and images an area including a lower end of the nozzle.

2. The mounting head of claim 1, wherein the imaging element holder is fixed to the nozzle shaft.

3. The mounting head of claim 1, wherein an imaging optical axis of the imaging element is inclined by a predetermined angle with respect to a vertical axis, and wherein the imaging element images the area including the lower end of the nozzle from an obliquely upward direction.

4. A component mounter comprising:
    the mounting head of claim 1; and
    a controller that operates the mounting head to mount the component on the board,
    wherein the controller operates the mounting head based on an image obtained by imaging by the imaging element, to mount the component sucked by the nozzle on the board.

5. The component mounter of claim 4, wherein after the component sucked by the nozzle is moved onto solder of the board, in a state in which both the component and the solder are included in the image, the controller grasps a positional relationship between the component and the solder, and operates the mounting head based on the positional relationship to bond the component to the solder.

6. The component mounter of claim 5, wherein the controller further comprises a storage unit including production data associated with the component, and wherein the controller comprises logic to:
    determine a position of a terminal end of the component;
    position the terminal end of the component above the solder;
    align the terminal end of the component based on the positional relationship between the component and the solder; and
    lower the nozzle shaft such that the terminal end of the component is bonded to the solder.

7. The component mounter of claim 5, wherein the controller further comprises a storage unit including production data associated with the component, and wherein the controller comprises logic to:
    determine a position of the component;
    position the component above the solder;
    align the component based on the positional relationship between the component and the solder; and
    lower the nozzle shaft such that the component is bonded to the solder.

8. The component mounter of claim 4, wherein the nozzle shaft is freely rotatable about a central axis line extending vertically, and wherein the controller rotates the nozzle shaft to secure an imaging area by the imaging element.

9. The component mounter of claim 4, wherein the controller further comprises: a storage unit including production data associated with the component, and wherein the controller comprises logic to:
    recognize a shape of the component based on the image;
    match the shape of the component with the production data; and
    determine whether the shape of the component coincides with the production data.

10. The component mounter of claim 4, wherein the controller further comprises a storage unit including production data associated with the component, and wherein the controller comprises logic to:
    recognize a shape of the solder based on the image obtained by the imaging element;
    match the shape of the solder with the production data; and
    determine whether the shape of the solder coincides with the production data.

11. The component mounter of claim 10, wherein the controller further comprises logic to send a notification if the solder is missing.

12. The mounting head of claim 1, wherein the imaging element holder further comprises a slider portion that is slidably guided by a guide portion provided in the mounting head, and wherein the slider portion is slid in the guide portion when the nozzle shaft moves upward and downward with respect to the mounting head.

13. The mounting head of claim 1, wherein the imaging element holder further comprises a downward extending portion including an element holder, and wherein the imaging element is detachably held in the element holder.

* * * * *